(12) United States Patent
Cirit et al.

(10) Patent No.: US 12,066,335 B2
(45) Date of Patent: Aug. 20, 2024

(54) SINGLE CALIBRATION TEMPERATURE BASED TEMPERATURE SENSING WITH DIFFERENTIAL SIGNAL GENERATION

(71) Applicant: Marvell Asia Pte Ltd., Singapore (SG)

(72) Inventors: Sadettin Cirit, Santa Clara, CA (US); Karthik S. Gopalakrishnan, Santa Clara, CA (US)

(73) Assignee: Marvell Asia Pte Ltd., Singapore (SG)

( * ) Notice: Subject to any disclaimer, the term of this patent is extended or adjusted under 35 U.S.C. 154(b) by 0 days.

(21) Appl. No.: 17/740,620

(22) Filed: May 10, 2022

(65) Prior Publication Data

US 2022/0326090 A1   Oct. 13, 2022

Related U.S. Application Data

(63) Continuation of application No. 16/576,639, filed on Sep. 19, 2019, now Pat. No. 11,326,961, which is a
(Continued)

(51) Int. Cl.
*G01K 13/00* (2021.01)
*G01K 1/14* (2021.01)
(Continued)

(52) U.S. Cl.
CPC .................. *G01K 7/00* (2013.01); *G01K 1/14* (2013.01); *G01K 7/01* (2013.01); *G01K 13/00* (2013.01);
(Continued)

(58) Field of Classification Search
CPC .... G01K 15/00; G01K 15/002; G01K 15/005; G01K 7/021; G01K 7/00; G01K 2213/00;
(Continued)

(56) References Cited

U.S. PATENT DOCUMENTS

| | | | |
|---|---|---|---|
| 3,431,781 A | * | 3/1969 | Wiggin ................. G01K 13/20 374/185 |
| 4,278,841 A | | 7/1981 | Regennitter et al. |

(Continued)

FOREIGN PATENT DOCUMENTS

| | | | | |
|---|---|---|---|---|
| CN | 102589729 A | * | 7/2012 | |
| CN | 107677393 A | * | 2/2018 | ........... G01K 15/005 |

(Continued)

OTHER PUBLICATIONS

17740620_Aug. 9, 2023_EP_0511602_A1_H.pdf,Nov. 1992.*
(Continued)

*Primary Examiner* — Gail Kaplan Verbitsky

(57) ABSTRACT

A temperature sensor system for an integrated circuit includes at least one sensor configured to generate a sensor signal indicative of a temperature in a respective location of the integrated circuit and a sensing module configured to receive the sensor signal, determine a temperature of the at least one sensor based on the sensor signal, an electrical characteristic of the at least one sensor, and a relationship between the electrical characteristic and the temperature of the at least one sensor, the relationship corresponding to variations in the electrical characteristic at a known calibration temperature, and generate a temperature signal based on the determined temperature.

21 Claims, 6 Drawing Sheets

Related U.S. Application Data continuation of application No. 15/409,828, filed on Jan. 19, 2017, now Pat. No. 10,458,856, which is a continuation of application No. 14/021,955, filed on Sep. 9, 2013, now Pat. No. 9,587,992, which is a continuation-in-part of application No. 13/802,219, filed on Mar. 13, 2013, now Pat. No. 9,212,952.

(51) Int. Cl.
   *G01K 7/00* (2006.01)
   *G01K 7/01* (2006.01)
   *G01K 15/00* (2006.01)
   *G01R 19/25* (2006.01)
   *H04Q 9/00* (2006.01)

(52) U.S. Cl.
   CPC ....... *G01K 15/005* (2013.01); *G01R 19/2503* (2013.01); *H04Q 9/00* (2013.01); *G01K 2219/00* (2013.01)

(58) Field of Classification Search
   CPC ........ G01K 2217/00; G01K 1/14; G01K 7/01; G01K 13/00; G01K 2219/00; G01R 19/2503; H04Q 9/00
   USPC ....... 374/1, 170, 178, 183; 702/99; 327/512, 327/513
   See application file for complete search history.

(56) References Cited

U.S. PATENT DOCUMENTS

| | | | |
|---|---|---|---|
| 4,480,312 A * | 10/1984 | Wingate | G01D 5/248 374/170 |
| 5,619,430 A | 4/1997 | Nolan | |
| 5,838,187 A * | 11/1998 | Embree | H03K 17/14 327/512 |
| 5,857,777 A * | 1/1999 | Schuh | G01K 15/00 374/170 |
| 6,028,472 A | 2/2000 | Nagumo | |
| 6,045,217 A * | 4/2000 | Nagata | B41J 2/06 219/483 |
| 6,736,540 B1 * | 5/2004 | Sheehan | G01K 7/01 374/178 |
| 7,168,853 B2 | 1/2007 | Ainspan et al. | |
| 7,808,068 B2 * | 10/2010 | Hartley | G01K 7/01 327/512 |
| 8,184,139 B2 | 5/2012 | Nagumo | |
| 8,337,082 B2 * | 12/2012 | Coursey | G01K 7/20 374/185 |
| 8,702,306 B2 * | 4/2014 | Mowry, Jr. | G01K 15/00 374/171 |
| 9,028,141 B2 | 5/2015 | Jeong | |
| 9,212,952 B1 | 12/2015 | Gopalakrishnan et al. | |
| 9,587,992 B1 | 3/2017 | Cirit | |
| 9,683,903 B2 | 6/2017 | Gopalakrishnan | |
| 10,458,856 B2 | 10/2019 | Cirit et al. | |
| 2001/0021217 A1 * | 9/2001 | Gunther | G06F 1/324 374/178 |
| 2003/0050998 A1 | 3/2003 | Garnett | |
| 2003/0158697 A1 * | 8/2003 | Gold | G06F 1/206 702/132 |
| 2004/0174923 A1 | 9/2004 | Sengoku | |
| 2005/0053118 A1 | 3/2005 | Stephan et al. | |
| 2007/0120551 A1 | 5/2007 | Shin et al. | |
| 2008/0130816 A1 | 6/2008 | Martin | |
| 2008/0144415 A1 * | 6/2008 | Macerola | G01K 7/01 374/163 |
| 2009/0030644 A1 | 1/2009 | Johns et al. | |
| 2009/0125267 A1 | 5/2009 | Johns et al. | |
| 2010/0141328 A1 * | 6/2010 | Meninger | H03L 7/0816 327/512 |
| 2010/0189160 A1 | 7/2010 | Kim et al. | |
| 2010/0285571 A1 * | 11/2010 | Coursey | G01K 15/00 374/185 |
| 2011/0080200 A1 | 4/2011 | Zhou | |
| 2011/0208471 A1 | 8/2011 | Lee | |
| 2012/0170616 A1 | 7/2012 | Tsai et al. | |
| 2013/0243107 A1 | 9/2013 | Chmelar | |
| 2013/0342256 A1 | 12/2013 | Wadhwa | |
| 2014/0097878 A1 | 4/2014 | Sindalovsky | |
| 2014/0286112 A1 | 9/2014 | Ide | |
| 2017/0131153 A1 | 5/2017 | Cirit | |
| 2022/0140826 A1 * | 5/2022 | Lazaro | H03K 17/145 327/378 |
| 2023/0273072 A1 * | 8/2023 | Cohen | G01K 15/005 374/166 |

FOREIGN PATENT DOCUMENTS

| | | | | |
|---|---|---|---|---|
| CN | 109863379 A | * | 6/2019 | ............ G01K 1/14 |
| EP | 0511602 A1 | * | 11/1992 | |
| EP | 078655 A2 | * | 7/1997 | |
| JP | 2005-004268 A | | 1/2005 | |
| JP | 2011215129 A | * | 10/2011 | |
| SU | 1307405 A1 | * | 4/1987 | |
| WO | WO-2006086263 A2 | * | 8/2006 | ............ G01K 1/024 |

OTHER PUBLICATIONS

17740620_Nov. 14, 2023_EP_0786755_A2_H.pdf,Jul. 1997.*
17740620_Nov. 13, 2023_CN_107677393_A_H.pdf.*
17740620_Nov. 14, 2023_CN_109863379_A_H.pdf.*
17740620_Aug. 9, 2023_JP_2011215129_A_H.pdf,Oct. 2011.*
17740620_Aug. 9, 2023_WO_2006086263_A2_H.pdf,Aug. 2006.*
17740620_Nov. 17, 2023_CN_102589729_A_H.pdf,Jul. 2012.*

* cited by examiner

SINGLE CALIBRATION TEMPERATURE BASED TEMPERATURE SENSING WITH DIFFERENTIAL SIGNAL GENERATION

CROSS-REFERENCE TO RELATED APPLICATIONS

The present application is a continuation of U.S. patent application Ser. No. 16/576,639, filed Sep. 19, 2019, which is a continuation of U.S. patent application Ser. No. 15/409,828, filed Jan. 19, 2017, now issued as U.S. Pat. No. 10,458,856 on Oct. 29, 2019, which is a continuation of U.S. patent application Ser. No. 14/021,955, filed Sep. 9, 2013, now issued as U.S. Pat. No. 9,587,992 on Mar. 7, 2017, which is a continuation-in-part patent application to the U.S. patent application Ser. No. 13/802,219, filed Mar. 13, 2013, now issued as U.S. Pat. No. 9,212,952 on Dec. 15, 2015, which is incorporated by reference herein for all purposes.

BACKGROUND OF THE INVENTION

The present invention relates to integrated circuits. More specifically, embodiments of the present invention provide methods and systems for temperature calibration and determination of an integrated circuit using a one-point calibration technique, where temperature is calibrated by a single temperature measurement and temperature determination is performed using known electrical characteristics of the integrated circuit.

Integrated circuits have proliferated through the years. As feature sizes become smaller, certain types of devices have become larger, leading to temperature related problems. That is, a large networking or processing device consumes a large amount of power, which is often dissipated as thermal energy such as heat. Heat is problematic and is desirably to be controlled and monitored. Unfortunately, conventional devices often lack suitable thermal sensing devices. That is, conventional temperature sensing devices are non-existent in many integrated circuit devices. At best, conventional sensing devices often use a diode device to monitor current information to extract temperature information from other non-integrated integrated circuit devices. The diode device is configured with an analog to digital converter to transmit the temperature information. The converter is often expensive, large, and difficulty to scale and manufacture in an efficient manner. Other limitations include difficulty in calibration, monitoring, and often require multi-point calibration, which leads to additional costs during the manufacture of the integrated circuit.

From the above, it is seen that techniques for improving temperature sensing and monitoring integrated circuits are highly desirable.

BRIEF SUMMARY OF THE INVENTION

The present invention relates to integrated circuits. More specifically, embodiments of the present invention provide methods and systems for determining temperatures of an integrated circuit using a one-point calibration technique, where temperature is determined by a single temperature measurement and calculation using known electrical characteristics of the integrated circuit.

Benefits are achieved over conventional techniques. Among other things, temperature calibration and determination can be performed by using measurements of corresponding electrical characteristics, such as voltage, current, delay, and/or others. Measuring electrical characteristics is usually faster and easier than measuring temperature. In addition, by using a single-point calibration method, the amount of time (which translates to manufacturing costs) of calibrating the temperature sensor is greatly reduced. It is to be appreciated that embodiments of the present invention are compatible with existing circuits and devices.

The present invention achieves these benefits and others in the context of known memory technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

The present invention relates to integrated circuits. More specifically, embodiments of the present invention provide methods and systems for determining temperatures of an integrated circuit using a one-point calibration technique, where temperature is determined by a single temperature measurement and calculation using known electrical characteristics of the integrated circuit.

Figure 1:
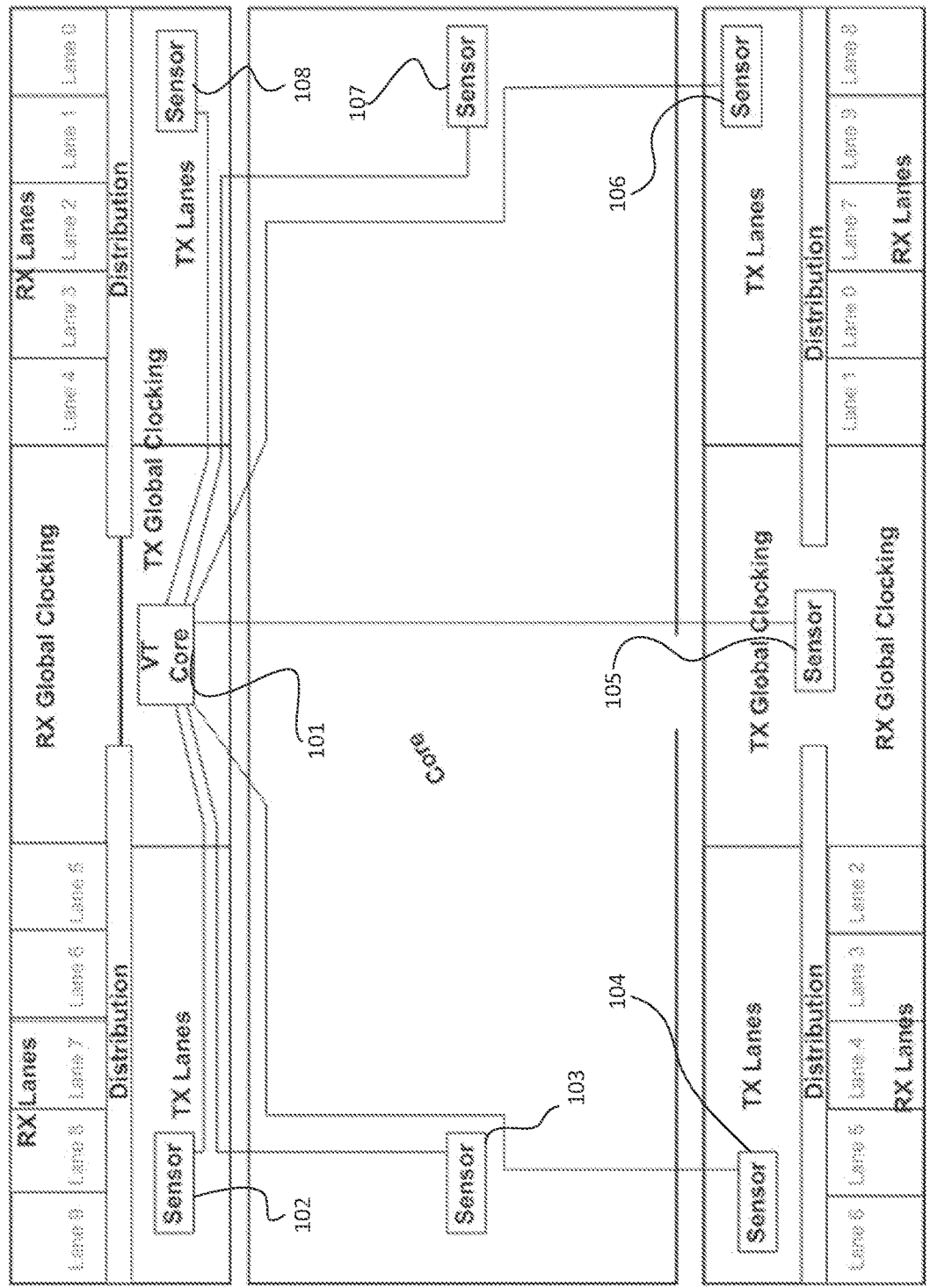
FIG. 1 is a simplified block diagram of a system on a chip integrated circuit device according to an embodiment of the present invention.

An integrated circuits such as SerDes typically have multiple locations that may heat up to a temperature greater than the optimal operating temperature. In various embodiments, the present invention provides sensing techniques for measuring these locations. FIG. 1 is a simplified block diagram of a system on a chip integrated circuit device according to an embodiment of the present invention. This diagram is merely an example, which should not unduly limit the scope of the claims. One of ordinary skill in the art would recognize many variations, alternatives, and modifications. As shown in FIG. 1, an integrated circuits comprises multiple locations that may need temperature and voltage sensing. For example, the integrated circuit in FIG. 1 is a SerDes device that includes a receiver and a transmitter, and it also has receiving lanes (e.g., RX Lanes) and transmission lanes (e.g., TX lanes). Sensors 102 and 108 are positioned within a proximity of TX lanes at the receiver end. Sensors 104 and 106 are positioned within a proximity of TX lanes at the transmission end. Sensors 103 and 107 are positioned at the center portion of the integrated circuit. For example, the sensors detect temperature and/or voltage information and send the information to the voltage-temperature (VT) core 101 as current levels. The VT core 101, as described below, is configured to process the current information and generates a digital read out of temperature information. In various embodiments, the sensors are capable of measure temperature from about 0 C to over 110 C.

It is to be appreciated that the VT core 101 can be integrated to the integrated circuit. In addition to the SerDes device as shown, the VT core 101 can be integrated with other types of devices, such as SerDes device, a DDR register device, a DSP device, a controller device, a microcontroller device, an ASIC device, or others. For example, an integrated communication device (e.g., SerDes device) is configured on a silicon bearing substrate. The device has a transmitter module and a receiver module, both of which are also configured on the silicon bearing substrate. Additionally, the device comprises a phase lock loop module that is also configured on the silicon bearing substrate. A digital logic core is configured on the same silicon bearing substrate as components of communication device. A voltage and temperature sensing module (e.g., the VT core that connects to the sensors) is configured on the substrate as well. An example of the voltage and temperature sensing module is illustrated in FIG. 2 and described below.

Figure 2:
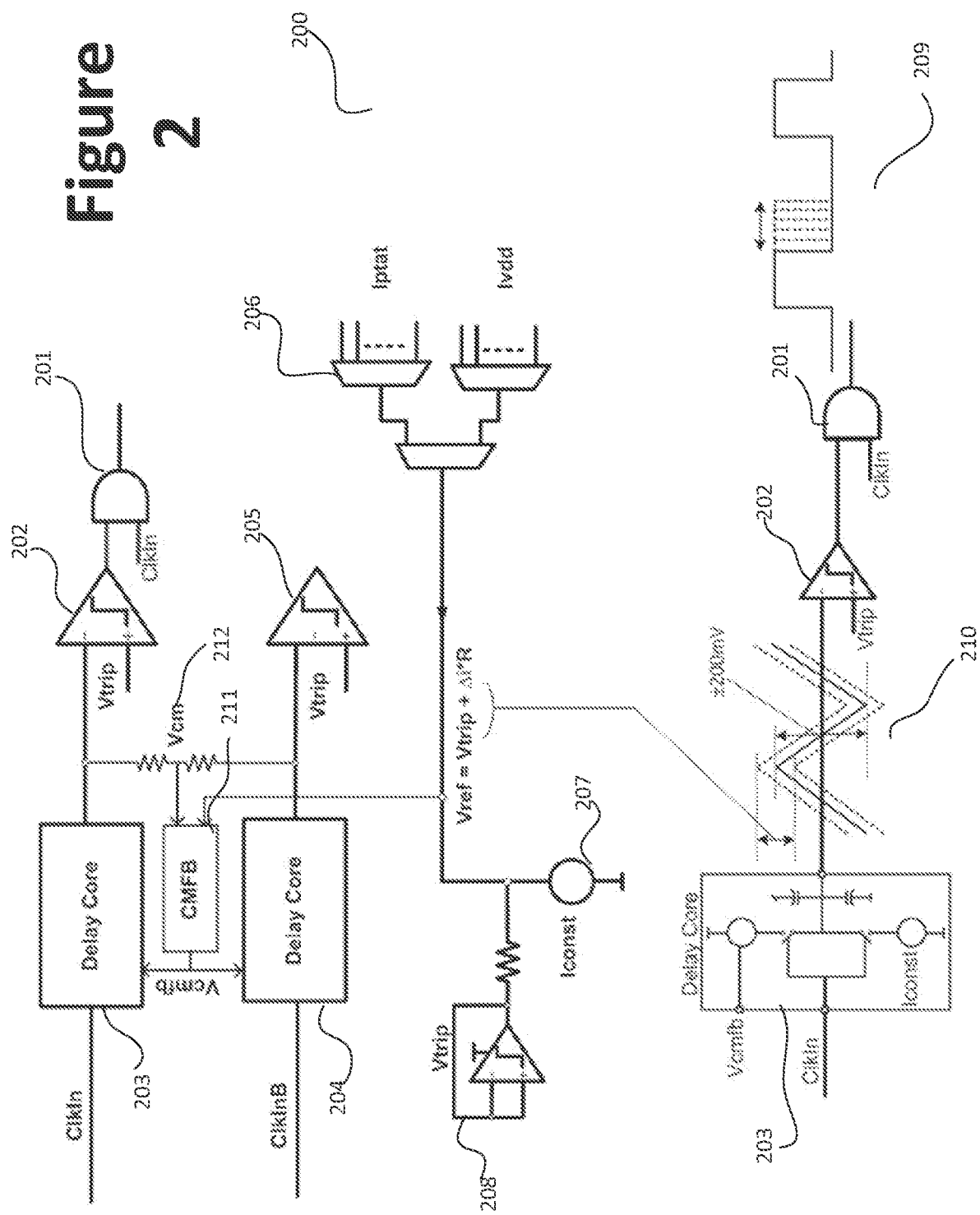
FIG. 2 is a block diagram of a sensing device with a multiplexer according to an embodiment of the present invention.

FIG. 2 is a block diagram of a sensing device with a multiplexer according to an embodiment of the present invention. This diagram is merely an example, which should not unduly limit the scope of the claims. One of ordinary skill in the art would recognize many variations, alternatives, and modifications. The voltage-temperature (VT) core 200 in FIG. 2 can be implemented as an integrated sensing device, and as shown receives a plurality of inputs from sensors (e.g., sensors 102-108 in FIG. 1). In a specific embodiment, analog components of the VT core 200 are on regulated power supply that reduces the possibility of introducing jitters.

In various embodiments, the VT core 200 and the sensors shown in FIG. 1 are manufactured using the same processes (e.g., 40 nm process, 28 nm process, etc.) as the integrated circuit that they measure. The sensor inputs are representative of voltage and/or temperature readings in the form of current levels. The multiplexer 206 is a part of the VT core 200 that allows the VT core 200 to selectively process the VT readings from the sensors one at a time. Depending on the application, the VT core 200 can have a large number of sensors. The selected current information (i.e., representative of temperature and/or voltage) is received by the reference generator 208. For example, the reference generator 208 as shown comprises a comparator and provides an output voltage Vtrip. The reference generator 208 is electrically coupled to the output of the multiplexer 206 and is configured to generate a signal proportional to the current information.

The VT core 200 comprises, among other components, a clock device, which is not shown in FIG. 2. The clock device is configured to generate at least a first clock signal and a second clock signal. The second clock signal is 180 degrees out of phase of the first clock signal. The VT core 200 further comprises delay cores 203 and 204. The first delay core 203 includes a first delay core output, and it is coupled to the clock device to receive the first clock signal. The second delay core 204 has a second delay core output. The second delay core is configured to receive the second clock signal. As shown in FIG. 2, the first delay core 203 is coupled to the second delay core 204 and shares a common feedback voltage (Vcmfb). Delay cores 203 and 204 are both connected to the common feedback signal. Together, the first delay core 203 and the second delay core 204 generate a differential signal that has a common mode representing a temperature reading during the temperature measurement mode, or a voltage reading during the voltage measurement mode. The lower portion of FIG. 2 provides a detailed view of delay core 203. For example, the delay core 204 is similarly configured.

The VT core 200 also includes a common load feedback (CMFB) circuit 211. The CMFB circuit 211 provides the common feedback voltage Vcmfb, which is coupled to the first delay core 203 and the second delay core 204. The CMFB circuit 211 is coupled to a voltage extractor 212. The voltage extractor 212 is also coupled to the outputs of the first delay core 203 and the second delay core 204. For example, the voltage extractor 212 comprises resistors configured in series. Depending on the implementation, the voltage extractor 212 can have different load configurations as well.

A common mode generator circuit 208 is coupled to the common load feedback circuit 211. The common mode generator circuit is configured to operate in a voltage measurement mode or a temperature measurement mode. A load equalizer device 205 is coupled to the second delay core 204 output and the common load voltage extractor 212 as shown.

A comparator device 202 is coupled to the first delay core 203 output and the common load voltage extractor 212. The comparator device 202 is configured to convert a first waveform 210 from the common mode voltage extractor to a second waveform. As shown at the bottom portion of FIG. 2, the first waveform 210 is a triangular waveform. The triangular waveform, as illustrated in FIG. 2, is a function of Vref=Vtrip+i*R. The principle of operation is described in more details below. With the help of the reference generator 208 that provides Vtrip voltage, the triangular waveform is provided from the delay core 203 and contains current information. Reading the triangular waveform and the Vtrip voltage (from the reference generator 208), the comparator 202 is configured to generate a square waveform (not shown in FIG. 2). The square waveform from the comparator 202 and a clock signal are coupled together by the logic gate 201 to generate a pulse width modulated signal 209. The clock signal can be generated by a pulse width generator. In a specific embodiment, the clock signal has a frequency of greater than 2 MHz. For example, the logic gate 201 is an AND gate. The output from the logic gate 201 can be used as a data signal that represents voltage and/or temperature reading of the sensors.

Figure 3:
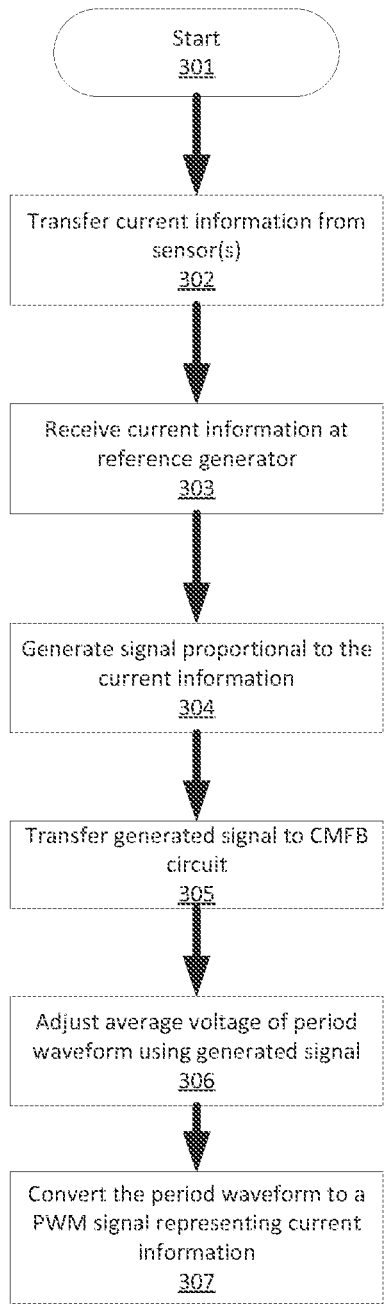
FIG. 3 is a simplified flow diagram illustrating the operation of a sensing device according to embodiments of the present invention.

FIG. 3 is a simplified flow diagram illustrating the operation of a sensing device according to embodiments of the present invention. This diagram is merely an example, which should not unduly limit the scope of the claims. One of ordinary skill in the art would recognize many variations, alternatives, and modifications. For example, the method illustrated in FIG. 3 can be implemented using the exemplary device shown in FIGS. 1 and 2, and various steps may be added, removed, repeated, modified, replaced, and/or overlapped. The method starts at step 301. For example, a temperature and voltage sensing device is started and initiated at step 301. For example, certain variables and/or parameters of the sensing device may be calibrated and/or adjusted at step 301. At step 302, current information from a remote sensing site within the integrated circuit device is transferred to a reference generator. In an embodiment, a multiplexer is used to select different current information from a number of sensing devices. The current information can be from one of many sensors that are connected to a VT core, which includes a reference generator. For example, the reference generator is configured to provide a reference voltage that can be used. As described above, the remote sensing site is provided on a spatial portion of one of a plurality of integrated circuit modules provided on the integrated circuit device. For example, the current information is a variable across an operating range of the integrated circuit device.

At step 303, the current information is received by the reference generator. The reference generator is configured to generate a signal proportional to the current information using the reference generator, at step 304. For example, the signal is a function of a reference voltage, current information from the sensing site, and known resistance (or impedance) value of one or more electrical components of the VT core. At step 305, the generated signal is transferred to a common mode feedback circuit, which is coupled to a first delay core and a second delay core. For example, the connections between the common feedback circuit and the delay cores are illustrated in FIG. 2. At step 306, an average voltage of a period waveform is adjusted using the generated signal at the common mode feedback. For example, the average voltage of the period waveform is a function of the reference voltage and current information received from the sensing site. The periodic waveform is converted to a PWM signal that is representative of the current information at a comparator device, at step 307. For example, the PWM signal can be generated by using the period waveform and a clock signal. The period waveform can be a triangular waveform, a square waveform, or a sinusoidal waveform. The PWM signal, depending on the need, may be transferred to a remote device that is not a part of the integrated circuit.

The PWM signal can be processed and used to provide digital information that represents temperature and/or voltage information embedded in the current information. In a specific embodiment, the pulse width modulated signal is received, and the pulse width modulated signal is used in a counter device to output digital information representative of the current information. As described above, the current information is associated with a temperature or a voltage of the remote sensing site. In an implementation, the pulse width modulated signal is received and processed by a low pass filter device.

In various embodiments, a calibration process is used to provide temperature calibration and measurement. During the calibration mode (which may be necessary as a one-time setup), the current reading from the sensor is calibrated to temperature reading. Running the constant current source at known current level and obtain a current reading from the sensor at a known temperature, the relationship between current reading and the temperature reading is determined. For example, a ratio (e.g., or referred to as "gain") between the current (or other voltage, delay) reading and the temperature level is determined and stored for later measurements. When measuring the temperature reading, the ratio is multiplied with a temperature difference from a reference temperature. For example, the following formula is used:

$$\text{Temp}=Tc+\text{Gain}^*\{\text{Delay2}-\text{Delay1}\}$$

Voltage calibration and measurement processes are performed similarly as the temperature calibration. A ratio (or "gain") between current reading and the voltage level is determined and stored for later measurements. When measuring the voltage reading, the ratio is multiplied with a voltage difference from a reference voltage. For example, the following formula is used:

$$\text{Voltage}=1V+\text{Gain}^*\{\text{Delay2}-\text{Delay1}\}$$

It is to be appreciated that the arrangement and implementation of temperature sensors illustrated in FIGS. 1-3 can provide accurate reading, the method of using temperatures is an important aspect as well. In various embodiments, the present invention provides techniques for quickly calibrating and determining temperature by relying on known relationship between electrical properties and temperature.

As explained above, temperature sensors are important in ensuring proper operation conditions for controls. For example, the integrated circuit device shown in FIG. 1 utilizes many temperature sensors so that temperatures at different location can be determined as needed. It is to be appreciated that the temperature sensor device in FIG. 2 is capable of determining temperature and providing the temperature reading quickly. But it is to be understood that it is important to have both good temperature sensing hardware and temperature sensing techniques. The temperature sensing techniques described below can be used in conjunction with the temperature sensing device in FIG. 2 and other temperature sensing systems and devices as well.

For temperature sensor readings to be useful and reliable, temperature sensors are calibrated before use. According to conventional techniques, calibrating temperature sensors requires temperature measurements at two or more temperatures. Unfortunately, calibration at two or more temperatures is a time consuming process. To measure an integrated circuit device or a chip at two temperatures, it is necessary to change the temperature of the subject (i.e., the integrated circuit) of temperature measurement in order to measure it at a second temperature. It often takes a lot of time to change the temperature (e.g., controlled heating up or cooling down) of a subject device, thereby increasing the manufacturing time, which translates to lower manufacturing throughput and higher cost, as manufacturing time is a considerable portion of the integrated circuit chip production cost.

According to embodiments of the present invention, temperature sensors can be calibrated with one temperature measurement, thereby reducing manufacturing costs. During the temperature determination process, values based on electrical characteristics are used to calibrate temperature sensor. More specifically, embodiments of the present invention use a value, current proportional to absolute temperature (IPTAT), to calibrate temperature at a single point. Among other things, the IPTAT value can be changed using one or more control switches. For example, IPTAT is sometimes referred to as Inversely Proportional to Absolute Temperature. In a specific embodiment, a control module is use to cause changes in IPTAT value. It is to be appreciated that the IPTAT value can be referred to in other terms as well. In a specific embodiment, IPTAT is a physical quantity whose value is equal to $k^*T^*\ln(M)/R$, where "k" is Boltzmann's constant, "T" is absolute temperature in Kelvin, "ln" is natural logarithm, "M" is a design constant, and "R" is the resistance value of a resistor. For example, the design constant M is derived based on the electrical and physical characteristics of the underlying integrated circuit and/or the temperature sensor.

It is to be appreciated that IPTAT here is used as a reference value, which is used for calibration purpose. For temperature calibration, other reference values, or code reflecting the values, can be used as well. In certain applications, it might be impractical to measure the IPTAT value. And in these applications, code values related to the temperature sensor calibration can be used. Depending on the application, code values can be more robust than the IPTAT, which is related to current measurement. For example, to calibrate the temperature sensor, one way is to change the IPTAT value by using the control switch to change one or more parameters of the sensor and/or the underlying device, at temperature T0.

For example, a new IPTAT value, IPTAT1, corresponds to a new temperature (or a new temperature equivalent). Similarly, a new code value, Code1, can also be used to correspond to a new temperature (or new temperature equivalent), where a code value is used to reflect one or more characteristics of the temperature sensor and/or underlying device.

Figure 4:
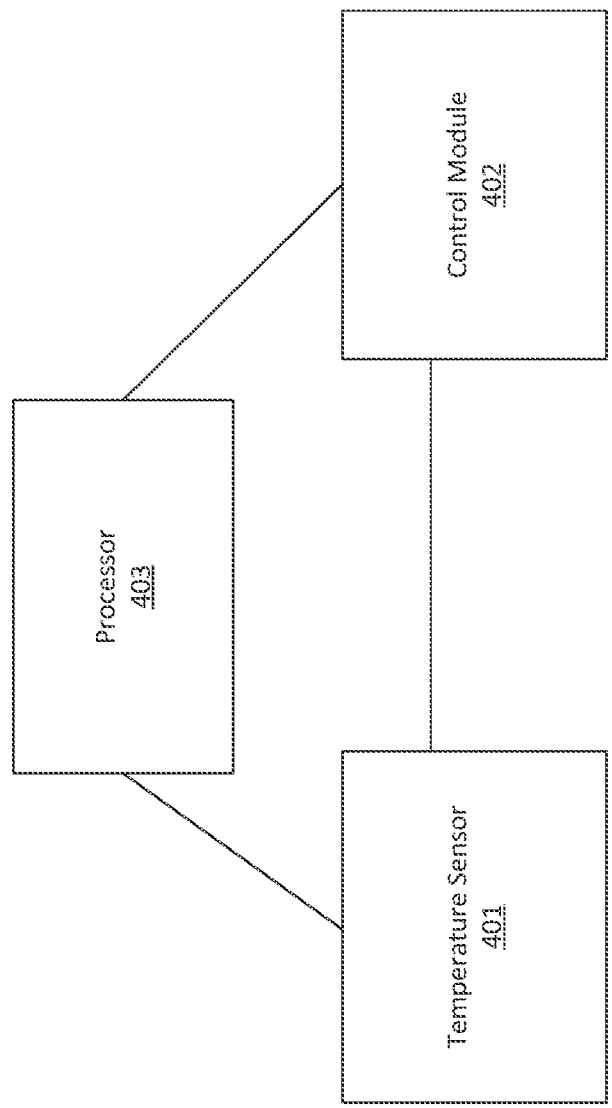
FIG. 4 is a simplified diagram illustrating a temperature sensor system according to an embodiment of the present invention.

FIG. 4 is a simplified diagram illustrating a temperature sensor system according to an embodiment of the present invention. This diagram is merely an example, which should not unduly limit the scope of the claims. One of ordinary skill in the art would recognize many variations, alternatives, and modifications. As shown in FIG. 4, the temperature sensor system comprises a temperature sensor 401, a processor 403, and the control module 402. In various implementations, the temperature sensor 401, a processor 403, and the control module 402 are implemented as a part of the integrated circuit devices whose temperature is to be monitored.

The temperature sensor 401, as the name suggests, is configured to take temperature readings as needed. The processor 403 is configure to process the temperature sensor readings, perform temperature calibration, and generate and use a line equation for temperature determination. As described below, temperature reading can be determined by using the line equation and value(s) associated with electrical characteristics (e.g., voltage, current, delay, and/or others). The control module 402 is configured to switch one or more operating parameters associated with the temperature sensor. In a specific embodiment, the control module 402 is capable of causing changes in IPTAT value. For example, the control module 402 is connected to a IPTAT current generator. It to be appreciated that temperature sensor 401, a processor 403, and the control module 402 can be integrated as a single unit (e.g., a part of an integrated temperature sensor) and/or implemented using various types of hardware module. Additional modules may be used as well. For example, the temperature sensor system in FIG. 4 may additionally include memory storage device that stores temperature calibration values, IPTAT values, line equations, temperature calibration and measurement instructions (executable by the processor 403).

Figure 5:
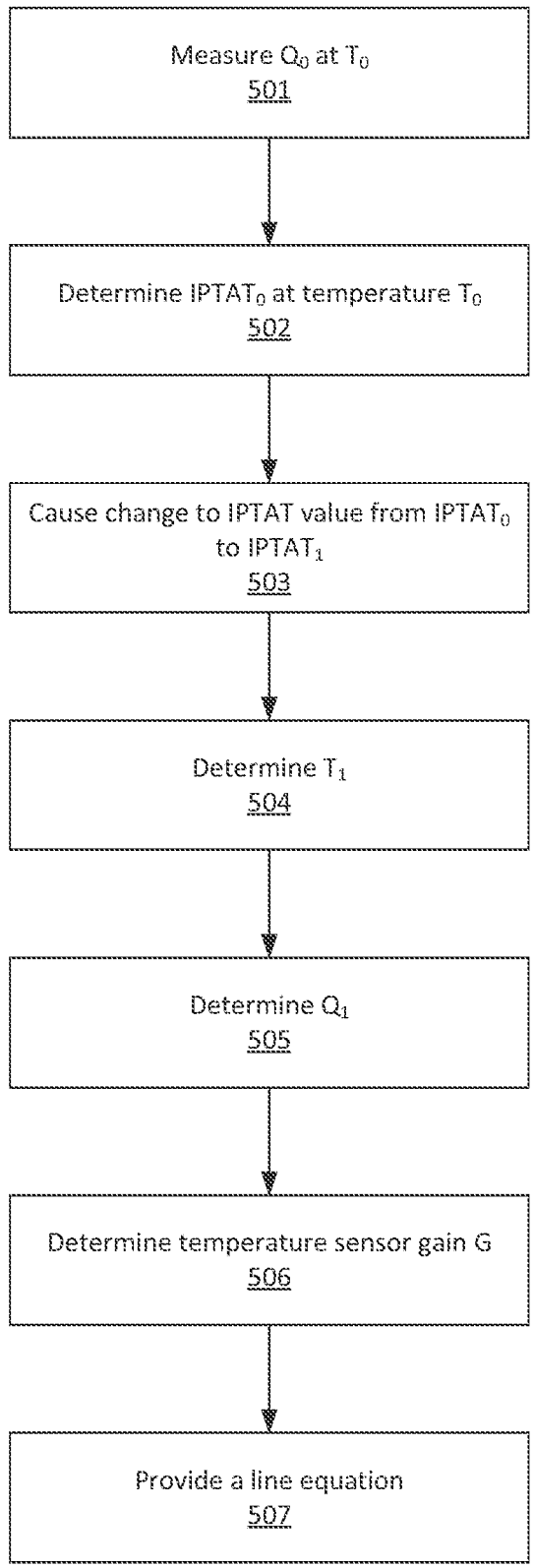
FIG. 5 is a simplified flow diagram illustrating a process for calibrating a temperature sensor according to an embodiment of the present invention.

FIG. 5 is a simplified flow diagram illustrating a process for calibrating a temperature sensor according to an embodiment of the present invention. This diagram is merely an example, which should not unduly limit the scope of the claims. One of ordinary skill in the art would recognize many variations, alternatives, and modifications. For example, various steps may be added, removed, repeated, modified, replaced, rearranged, and/or repeated, which should not unduly limit the claims.

For the purpose of temperature sensor calibration, an initial IPTAT value, IPTAT$_0$ is to be determined. For IPTAT$_0$ value determination, calibration temperature T$_0$ and value(s) associated with electrical characteristics are needed.

At step 501, a value Q$_0$ is measure at the calibration temperature T$_0$. For example, the calibration temperature can be near room temperature, thereby allowing the integrated circuit to quickly reach T$_0$ for quick measurement. For example, to determine IPTAT$_0$, voltage, current, and/or delay values corresponding to the calibration temperature T$_0$ are measured as well. For example, measured value of electrical characteristics (e.g., voltage, current, and/or delay) is denoted as Q$_0$.

At step 502, the IPTAT$_0$ is determined at the calibration temperature T$_0$. As explained above, the IPTAT$_0$ value can be calculated from known "M" and "R" value, and one or more Q$_0$ value(s). It is to be appreciated that the IPTAT value determination may involve using other formulae and/or variables as well.

For calibration to work, a second IPTAT value, IPTAT$_1$, is to be determined. As explained below, multiple (e.g., 2) IPTAT values are needed to generate a linear equation that can be used for later temperature determination. To cause the IPTAT value to change from IPTAT$_0$ to IPTAT$_1$, control switches can be used to change one or more electrical characteristics (e.g., voltage, current, delay, and/or others). At step 503, the IPTAT value is changed from IPTAT$_0$ to IPTAT$_1$, and corresponding current is changed accordingly. As mentioned above, a control module may be used to cause changes in the IPTAT value. The change from IPTAT$_0$ to IPTAT$_0$ can be made quickly and within a time period the temperature is still at (or very close to) temperature T$_0$. For the purpose of calibration, an equivalent temperature T$_1$ corresponding to the IPTAT$_1$ is determined.

At step 504, a new temperature T$_1$ is determined. As explained above, the actual temperature corresponding to IPTAT$_1$ and current is substantially the same as T$_0$. However, for the purpose of temperature calibration, current value and IPTAT$_1$ correspond to the new temperature T$_1$. Even though the actual or operating temperature has not changed, temperature sensor is operating at a new "equivalent" temperature because of the change of IPTAT. Similarly, if code value is used instead of IPTAT, the equivalent temperature calculation is performed using the code value.

The new "equivalent" temperature is calculated as below:

$$T_1 = T_0 * (IPTAT_1 / IPTAT_0) \quad \text{(Equation 1)}$$

And in case code value is used:

$$T_1 = T_0 * (Code_1 / Code_0) \quad \text{(Equation 1A)}$$

Corresponding to the change of IPTAT from IPTAT$_0$ to IPTAT$_1$, the value associated with the one or more electrical characteristics Q$_1$ is measure. For example, Q$_1$ can be voltage, current, delay, or other value that corresponds to T$_1$.

At step 506, a gain value "G" of the temperature sensor is determined. More specifically, the gain ("G") of the temperature sensor is calculated using the equation below:

$$G = (Q_1 - Q_0)/(T_1 - T_0) \quad \text{(Equation 2)}$$

At step 507, a line equation is provided. Among other things, the line equation can used to provide temperature reading by reading one or more values corresponding to electrical characteristics. In a specific embodiment, the line equation of the temperature sensor is calculated as:

$$Q_{(T)} = G*(T - T_0) + Q_0 \quad \text{(Equation 3)}$$

For example, to obtain a temperature measurement T$_m$, Equation 3 and the electrical characteristics can be used. A reading of an electrical characteristics (e.g., voltage, current, delay, and/or others), or Q$_m$, that corresponds to actual temperature is determined. The following equation is used to obtain the temperature measurement T$_m$:

$$T_m = \{Q(T_m) + G*T_0 - Q_0\}/G. \quad \text{(Equation 4)}$$

It is to be appreciated that temperature can quickly be re-calibrated and determined using Equation 4, as electrical characteristics are typically easier to determine than temperature reading. For example, the method illustrated in FIG. 4 can be implemented using the temperature sensor system in FIG. 4.

To provide an example, temperature calibration is performed using, among other things, the delay characteristic at calibration temperature $T_c$:

$$I_1 = IPTAT(Tc) = \frac{kTc * \ln(M)}{q * R1}$$

At a second IPTAT value, or IPTAT(Tc+$\Delta T_2$) is:

$$I_2 = IPTAT(Tc + \Delta T_2) = \frac{k(Tc + \Delta T2) * \ln(M)}{q * R1}$$

Or changing the calibration code "m" times so that:

$$I_2 = IPTAT(Tc + \Delta T_2) = \frac{m(kTc) * \ln(M)}{q * R1}$$

The temperature change (equivalent) based on "delay2" can by determined by:

$$\Delta T_2 = Tc * \left( \frac{IPTAT(Tc + \Delta T2)}{IPTAT(Tc)} - 1 \right)$$

Similarly, a third IPTAT value, IPTAT(Tc+$\Delta T_3$) is:

$$I_3 = IPTAT(Tc + \Delta T_3) = \frac{k(Tc + \Delta T3) * \ln(M)}{q * R1}$$

Or changing the calibration code "n" times so that:

$$I_3 = IPTAT(Tc + \Delta T_3) = \frac{n(kTc) * \ln(M)}{q * R1}$$

The temperature change (equivalent) based on "delay3" can by determined by:

$$\Delta T_3 = Tc * \left( \frac{IPTAT(Tc + \Delta T3)}{IPTAT(Tc)} - 1 \right)$$

$$\Delta T = Tc * \left( \frac{I3 - I2}{I1} \right)$$

$\Delta$delay = delay3 - delay2

And therefore, the temperature change relative to the delay value is:

$$TempGain = \frac{\Delta delay}{\Delta T}$$

It is to be appreciated that the use of gain factor and linear equation to obtain temperature reading is an interpolation process, who error is characterized by Equation 5 below:

Error=Delay(T)−{Gain$_{ipt}$×(T−Tc)+Delay(T)|$_{T=Tc}$}  (Equation 5)

Figure 6:
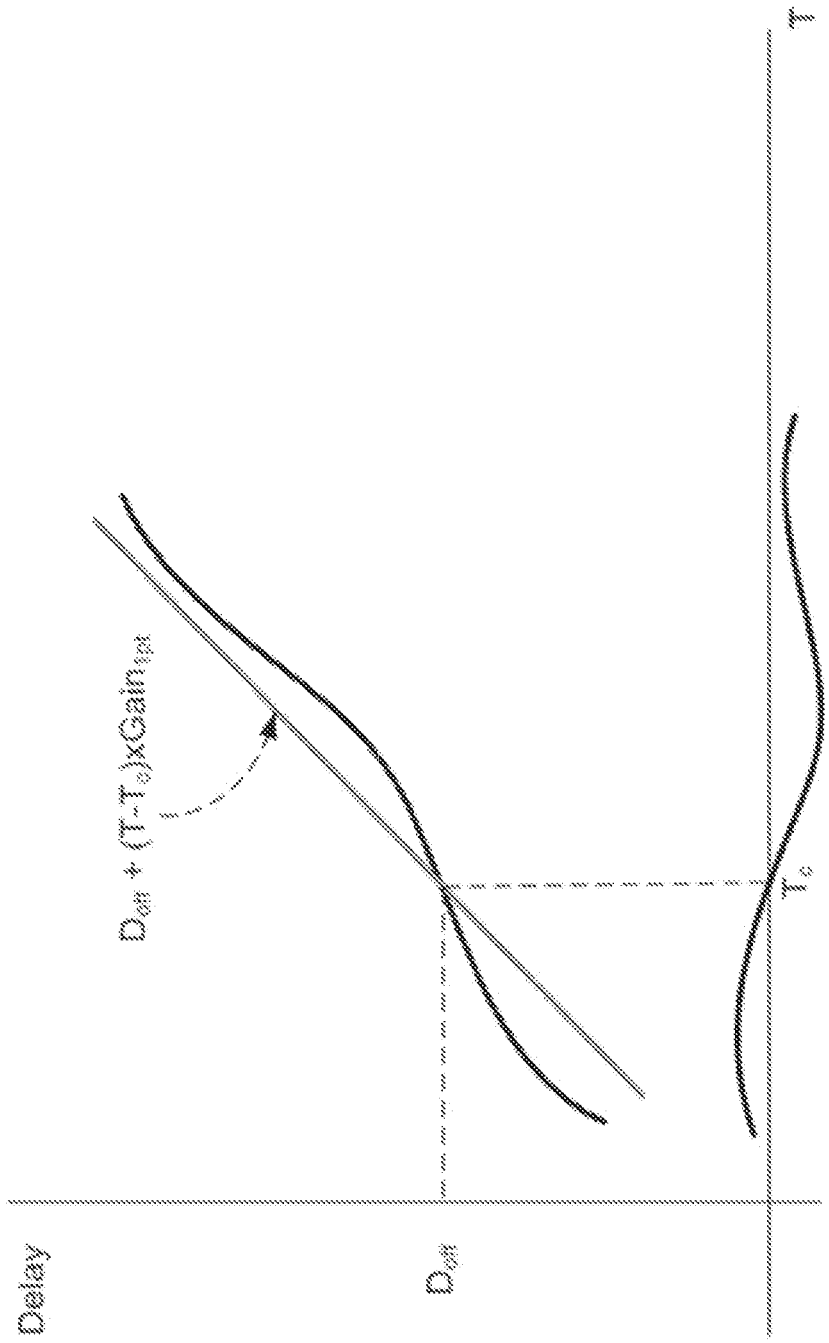
FIG. 6 is a simplified graph illustrating one point error calculation according to embodiments of the present invention.

FIG. 6 is a simplified graph illustrating one point error calculation according to embodiments of the present invention. This diagram is merely an example, which should not unduly limit the scope of the claims. One of ordinary skill in the art would recognize many variations, alternatives, and modifications.

As explained above, one-point temperature calibration process can more efficient and cost-effective compared to conventional two-point calibration processes. Tables below are provided to compare the temperature determined by one-point calibration process according to an implementation of the present invention to temperature determined using conventional two-point calibration technique.

Table 1 below shows junction temperature calculation from chamber temperature and power consumption Junction Temperature Calculation from Chamber Temperature and Power Consumption

TABLE 1

| Chamber Temp[° C.] | Chip Power[W] | $\Delta$T[° C.] | Junction Temp[° C.] |
|---|---|---|---|
| −9.8 | 1.842 | 13.44 | 3.64 |
| −0.1 | 1.877 | 13.70 | 13.60 |
| 10.2 | 1.985 | 14.49 | 24.69 |
| 20.3 | 1.923 | 14.04 | 34.34 |
| 27 | 2.114 | 15.43 | 42.43 |
| 40.1 | 1.975 | 14.42 | 54.52 |
| 50 | 2.032 | 14.83 | 64.83 |
| 59.9 | 2.174 | 15.87 | 75.77 |
| 70 | 2.120 | 15.48 | 85.48 |
| 79.6 | 2.265 | 16.53 | 96.13 |
| 89.9 | 2.320 | 16.93 | 106.83 |

As shown in Table 1, the ambient chamber temperature is adjusted, and power is measure. Then the junction temperature is calculated. For example, the equivalent temperature is calculated using the techniques according to embodiments of the present invention.

In comparison, conventional two-point temperature calibration requires a change in junction temperature, as illustrated in Table 2 below:

TABLE 2

| Junction Temp[° C.] | Delay | Temp | Error |
|---|---|---|---|
| 3.64 | 43.75272727 | 3.64 | 0.00 |
| 13.60 | 51.32412121 | 14.86 | 1.26 |
| 24.69 | 59.26787879 | 26.64 | 1.94 |
| 34.34 | 65.47393939 | 35.83 | 1.50 |
| 42.43 | 69.94230303 | 42.45 | 0.02 |
| 54.52 | 77.01721212 | 52.94 | −1.58 |
| 64.83 | 86.26424242 | 66.64 | 1.81 |
| 75.77 | 93.58739394 | 77.50 | 1.73 |
| 85.48 | 100.2278788 | 87.34 | 1.86 |
| 96.13 | 106.0615758 | 95.98 | −0.15 |
| 106.83 | 113.3847273 | 106.83 | 0.00 |

In a conventional two-point calibration process, junction temperature is changed and the corresponding delay is measured. By using the relationship between the delay value and the junction temperature, gain and offset values for the system can be determined for the two-point calibration method. The gain and offset values, once determined, provide a basis for the line equation associated with the temperature sensor system. The line equation can then be used to determine junction temperature value.

Table 3 illustrates a process of using code value to perform one-point temperature calibration:

TABLE 3

| 1Point Calibration Code | Equivalent Temp [° C.] | Delay (ns) |
|---|---|---|
| 0 0 1 0 | 12.39 | 49.33818182 |
| 0 0 1 1 | 27.41 | 58.70933333 |
| 0 1 0 0 (Default) | 42.43 | 69.94230303 |
| 0 1 0 1 | 57.46 | 79.12727273 |
| 0 1 1 0 | 72.48 | 89.49139394 |
| 0 1 1 1 | 87.50 | 99.3590303 |
| 1 0 0 0 | 102.52 | 110.4678788 |
| 1 0 0 1 | 117.54 | 119.5907879 |

| Gain1Point | Offset1Point |
|---|---|
| 0.673 | 40.78 |

As illustrated in Table 3, calibration code value is changed. Based on the change in calibration code value, the equivalent temperature value is determined. The delay value (measure in nanosecond) is also measured. Using the calibration code value, equivalent temperature, and delay value, gain and offset value for the one point calibration equation can be determined.

Table 4 below illustrates using the one-point calibration equation determined from Table 3 to determine junction temperature:

TABLE 4

| Junction Temp[° C.] | Temp[° C.] | Error[° C.] |
|---|---|---|
| 3.64 | 4.42 | 0.77 |
| 13.60 | 15.67 | 2.06 |
| 24.69 | 27.47 | 2.78 |
| 34.34 | 36.69 | 2.36 |
| 42.43 | 43.33 | 0.90 |
| 54.52 | 53.84 | −0.67 |
| 64.83 | 67.58 | 2.75 |
| 75.77 | 78.47 | 2.70 |
| 85.48 | 88.33 | 2.86 |
| 96.13 | 97.00 | 0.87 |
| 106.83 | 107.88 | 1.05 |

For example, the gain value and offset value determined from Table 3 is used to provide a line equation, which is then used to provide junction temperature information based on other known values. It is to be appreciated that while the junction temperature determined using the linear equation determined using an one-point calibration method is slightly different from the actual temperature, the amount of error is relatively small and acceptable for most of the application where a temperature reading is needed.

It is also to be noted that the amount of error from an exemplary one-point calibration method is comparable to the amount of error from a conventional two-point calibration method, as illustrated in Table 5 below:

TABLE 5

| Error_2PointCalibration[° C.] | Error_1PointCalibration[° C.] |
|---|---|
| 0.00 | 0.77 |
| 1.26 | 2.06 |
| 1.94 | 2.78 |
| 1.50 | 2.36 |
| 0.02 | 0.90 |

TABLE 5-continued

| Error_2PointCalibration[° C.] | Error_1PointCalibration[° C.] |
|---|---|
| −1.58 | −0.67 |
| 1.81 | 2.75 |
| 1.73 | 2.70 |
| 1.86 | 2.86 |
| −0.15 | 0.87 |
| 0.00 | 1.05 |

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A temperature sensor system for an integrated circuit, the temperature sensor system comprising:
   a sensor having an electrical characteristic and configured to generate a sensor signal indicative of a detected value of the electrical characteristic for a measured temperature of a portion of the integrated circuit where the sensor is located;
   a first delay core and a second delay core configured to generate a differential signal, the differential signal being generated based on the sensor signal; and
   a sensing module configured to
      store a relationship between the electrical characteristic of the sensor and temperature of the sensor, the relationship defining variations in the electrical characteristic and including a single calibration temperature of the sensor, the single calibration temperature being independent of the measured temperature,
      receive the sensor signal,
      determine the measured temperature based on i) the detected value of the electrical characteristic of the sensor, and ii) the relationship between the electrical characteristic and temperature of the sensor, and
      generate a temperature signal based on the differential signal and the measured temperature.

2. The temperature sensor system of claim 1, wherein the relationship includes a gain associated with the sensor.

3. The temperature sensor system of claim 1, further comprising a common load feedback circuit configured to generate a common feedback voltage based on the sensor signal, and to provide the common feedback voltage to the first delay core and the second delay core.

4. The temperature sensor system of claim 1, further comprising a plurality of sensors arranged to detect temperatures of respective portions of the integrated circuit, the plurality of sensors comprising the sensor configured to generate the sensor signal,
   wherein the sensing module is configured to, for each of the plurality of sensors,
      storing a relationship between an electrical characteristic of that sensor and temperature,
      selecting a respective sensor signal for that sensor,
      determining a measured temperature of the respective portion of the integrated circuit based on the respective sensor signal and the relationship between the electrical characteristic of that sensor and temperature, and
      generating a respective temperature signal based on the measured temperature determined for that sensor.

5. The temperature sensor system of claim 1, wherein the relationship includes the detected value of the electrical characteristic and a value of the electrical characteristic for the single calibration temperature.

6. The temperature sensor system of claim 1, wherein the relationship includes the measured temperature.

7. The temperature sensor system of claim 1, wherein the relationship includes no other calibration temperature than the single calibration temperature.

8. A temperature sensor system for an integrated circuit, the temperature sensor system comprising:
a sensor having an electrical characteristic and configured to generate a sensor signal indicative of a detected value of the electrical characteristic, the sensor signal being a current signal and the relationship including a current gain associated with the sensor;
a first delay core and a second delay core configured to generate a differential signal, the differential signal being generated based on the sensor signal; and
a sensing module configured to
store a relationship between the electrical characteristic of the sensor and temperature of the sensor, the relationship defining variations in the electrical characteristic based on a single calibration temperature of the sensor,
receive the sensor signal,
determine a measured temperature of a portion of the integrated circuit based on i) the detected value of the electrical characteristic of the sensor, and ii) the relationship between the electrical characteristic and temperature of the sensor, and
generate a temperature signal based on the differential signal and the measured temperature.

9. A temperature sensor system for an integrated circuit, the temperature sensor system comprising:
a sensor having an electrical characteristic and configured to generate a sensor signal indicative of a detected value of the electrical characteristic, the electrical characteristic being a delay associated with the sensor at a single calibration temperature;
a first delay core and a second delay core configured to generate a differential signal, the differential signal being generated based on the sensor signal; and
a sensing module configured to
store a relationship between the electrical characteristic of the sensor and temperature of the sensor, the relationship defining variations in the electrical characteristic based on the single calibration temperature of the sensor,
receive the sensor signal,
determine a measured temperature of a portion of the integrated circuit based on i) the detected value of the electrical characteristic of the sensor, and ii) the relationship between the electrical characteristic and temperature of the sensor, and
generate a temperature signal based on the differential signal and the measured temperature.

10. The temperature sensor system of claim 9, wherein the relationship is based on variations in the delay caused by variations in a second electrical characteristic of the sensor at the single calibration temperature.

11. The temperature sensor system of claim 10, wherein the second electrical characteristic is a current reference value.

12. The temperature sensor system of claim 11, wherein the current reference value is proportional to an absolute temperature of the sensor.

13. A method of operating a temperature sensor system for an integrated circuit, the method comprising:
storing a relationship between an electrical characteristic of a sensor and temperature of the sensor, the relationship defining variations in the electrical characteristic and including a single calibration temperature of the sensor;
generating a sensor signal via the sensor, the sensor signal being indicative of a detected value of the electrical characteristic for a measured temperature of a portion of the integrated circuit where the sensor is located, the measured temperature being independent of the single calibration temperature;
generating a differential signal via a plurality of delay cores based on the sensor signal;
determining the measured temperature based on i) the detected value of the electrical characteristic of the sensor, and ii) the relationship between the electrical characteristic and temperature of the sensor; and
generating a temperature signal based on the differential signal and the measured temperature.

14. The method of claim 13, wherein the relationship includes a gain associated with the sensor.

15. The method of claim 13, wherein the sensor signal is a current signal and the relationship includes a current gain associated with the sensor.

16. The method of claim 13, wherein the electrical characteristic is a delay associated with the sensor at the single calibration temperature.

17. The method of claim 16, wherein the relationship corresponds to variations in the delay caused by variations in a second electrical characteristic of the sensor at the single calibration temperature.

18. The method of claim 17, wherein the second electrical characteristic is a current reference value.

19. The method of claim 18, wherein the current reference value is proportional to an absolute temperature of the sensor.

20. The method of claim 13, further comprising:
generating a common feedback voltage based on the sensor signal; and
providing the common feedback voltage to the plurality of delay cores.

21. The method of claim 13, further comprising:
generating a plurality of sensor signals via a plurality of sensors arranged to detect temperatures of respective portions of the integrated circuit, the plurality of sensors comprising the sensor generating the sensor signal; and
for each of the plurality of sensors,
storing a relationship between an electrical characteristic of that sensor and temperature,
selecting a respective sensor signal for that sensor,
determining a measured temperature of that sensor based on the respective sensor signal and the relationship between the electrical characteristic of that sensor and temperature, and
generating a respective temperature signal based on the measured temperature determined for that sensor.

* * * * *